United States Patent
Liou

(10) Patent No.: US 8,536,575 B2
(45) Date of Patent: Sep. 17, 2013

(54) PIXEL STRUCTURE OF DISPLAY PANEL AND METHOD OF FABRICATING THE SAME

(75) Inventor: Meng-Chi Liou, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 44 days.

(21) Appl. No.: 13/342,214

(22) Filed: Jan. 3, 2012

(65) Prior Publication Data

US 2013/0082265 A1   Apr. 4, 2013

(30) Foreign Application Priority Data

Oct. 3, 2011   (TW) .............................. 100135730 A

(51) Int. Cl.
*H01L 29/04*   (2006.01)
*H01L 21/00*   (2006.01)

(52) U.S. Cl.
USPC .............. 257/59; 257/E33.053; 257/E33.062; 438/34

(58) Field of Classification Search
CPC ... H01L 27/12; H01L 27/1212; G02F 1/1362; G02F 1/136227
USPC ....... 257/59, 71, E33.053, E33.062; 438/22, 438/34, 38
See application file for complete search history.

(56) References Cited

U.S. PATENT DOCUMENTS

| | | | |
|---|---|---|---|
| 6,195,140 B1 * | 2/2001 | Kubo et al. ...................... | 349/44 |
| 6,660,555 B2 * | 12/2003 | Kim ................................ | 438/57 |
| 2005/0094046 A1 | 5/2005 | Cho | |
| 2007/0187687 A1 * | 8/2007 | Liou et al. ........................ | 257/72 |
| 2007/0273803 A1 * | 11/2007 | Liou et al. ........................ | 349/43 |
| 2009/0059110 A1 * | 3/2009 | Sasaki et al. .................... | 349/39 |
| 2011/0205478 A1 | 8/2011 | Nakahara | |

FOREIGN PATENT DOCUMENTS

TW   I298543   7/2008

* cited by examiner

*Primary Examiner* — Nikolay Yushin
(74) *Attorney, Agent, or Firm* — Winston Hsu; Scott Margo

(57) ABSTRACT

A pixel structure of a display panel includes a substrate, a thin film transistor (TFT), a first transparent connecting pad, a passivation layer and a transparent pixel electrode. The TFT disposed on the substrate includes a gate electrode, a gate insulating layer, a semiconductor layer, a source electrode and a drain electrode. The gate insulating layer is disposed on the gate electrode, the semiconductor layer is disposed on the gate insulating layer, and the source electrode and the drain electrode are disposed on the semiconductor layer. The first transparent connecting pad disposed on the drain electrode partially overlaps and is electrically connected to the drain electrode. The passivation layer disposed on the first transparent connecting pad includes at least a contact hole. Furthermore, the transparent pixel electrode disposed on the passivation layer is electrically connected to the first transparent connecting pad through the contact hole of the passivation layer.

7 Claims, 9 Drawing Sheets

PIXEL STRUCTURE OF DISPLAY PANEL AND METHOD OF FABRICATING THE SAME

BACKGROUND OF THE INVENTION

1. Field of the Invention

The present invention relates to a pixel structure of a display panel and a method of fabricating the same, and more particularly, to a pixel structure of a display panel having high aperture ratio and a method of fabricating the same.

2. Description of the Prior Art

Display panels have been widely applied in various kinds of electronic products to meet requirements of light weight, thin structure and small size. Additionally, consumers intend to survey websites or watch movies with the better viewing quality, so that increasing the resolution of the display panel has become one important developing aspect of display panel technology.

In order to improve the resolution, it is common to increase the number of the pixel structures of the display panel. However, the additional metal lines of the pixel structures lower the aperture ratio and affect the utilization ratio of the backlight. Accordingly, the brightness of the display panel decreases. In order to compensate the loss of brightness, the power consumption of the backlight module needs to be increased.

Consequently, how to increase the aperture ratio of display panel for simultaneously providing the required resolution and the sufficient brightness is an important issue in this field.

SUMMARY OF THE INVENTION

It is one of the objectives of the present invention to provide a pixel structure of a display panel and a method of fabricating the same, in order to increase the aperture ratio of said display panel.

According to one exemplary embodiment of the present invention, a pixel structure of a display panel is provided. The pixel structure of a display panel includes a substrate, a thin film transistor (TFT), a first transparent connecting pad, a passivation layer and a transparent pixel electrode. The thin film transistor disposed on the substrate includes a gate electrode, a gate insulating layer, a semiconductor layer, a source electrode and a drain electrode. The gate insulating layer is disposed on the gate electrode and the substrate, the semiconductor layer is disposed on the gate insulating layer, and the source electrode and the drain electrode are disposed on the semiconductor layer. The first transparent connecting pad is disposed on the drain electrode, and the first transparent connecting pad partially overlaps and is electrically connected to the drain electrode. The passivation layer is disposed on the first transparent connecting pad, and the passivation layer includes at least a contact hole at least partially exposing the first transparent connecting pad. Furthermore, the transparent pixel electrode disposed on the passivation layer is electrically connected to the first transparent connecting pad through the contact hole of the passivation layer.

According to another exemplary embodiment of the present invention, a method of fabricating a pixel structure of a display panel includes the following steps. First, a substrate is provided, and a thin film transistor is formed on the substrate. The thin film transistor includes a gate electrode, a gate insulating layer, a semiconductor layer, a source electrode and a drain electrode. The gate insulating layer is disposed on the gate electrode and the substrate, the semiconductor layer is disposed on the gate insulating layer, then the source electrode and the drain electrode are disposed on the semiconductor layer. After that, a first transparent connecting pad is formed on the drain electrode, and the first transparent connecting pad partially overlaps and is electrically connected to the drain electrode. Moreover, a passivation layer is formed on the first transparent connecting pad, and the passivation layer includes at least a contact hole at least partially exposing the first transparent connecting pad. Furthermore, a transparent pixel electrode is formed on the passivation layer, which is electrically connected to the first transparent connecting pad through the contact hole of the passivation layer.

The present invention provides a transparent connecting pad used to electrically connect the transparent pixel electrode to the drain electrode, wherein the transparent connecting pad is disposed on the drain electrode, partially overlaps and is electrically connected to the drain electrode. The transparent connecting pad may be an extension of the drain electrode, i.e. the region where the drain electrode is electrically connected to other elements. Accordingly, the transparent connecting pad is made of transparent materials and can substitute for a part of the conventional drain electrode, which is made of opaque metal, for enlarging the transparent region in the pixel structure. Hence, the aperture ratio of the pixel structure can be increased.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail herein. The preferred exemplary embodiments of the present invention are illustrated in the accompanying drawings with numbered elements.

Figure 1:
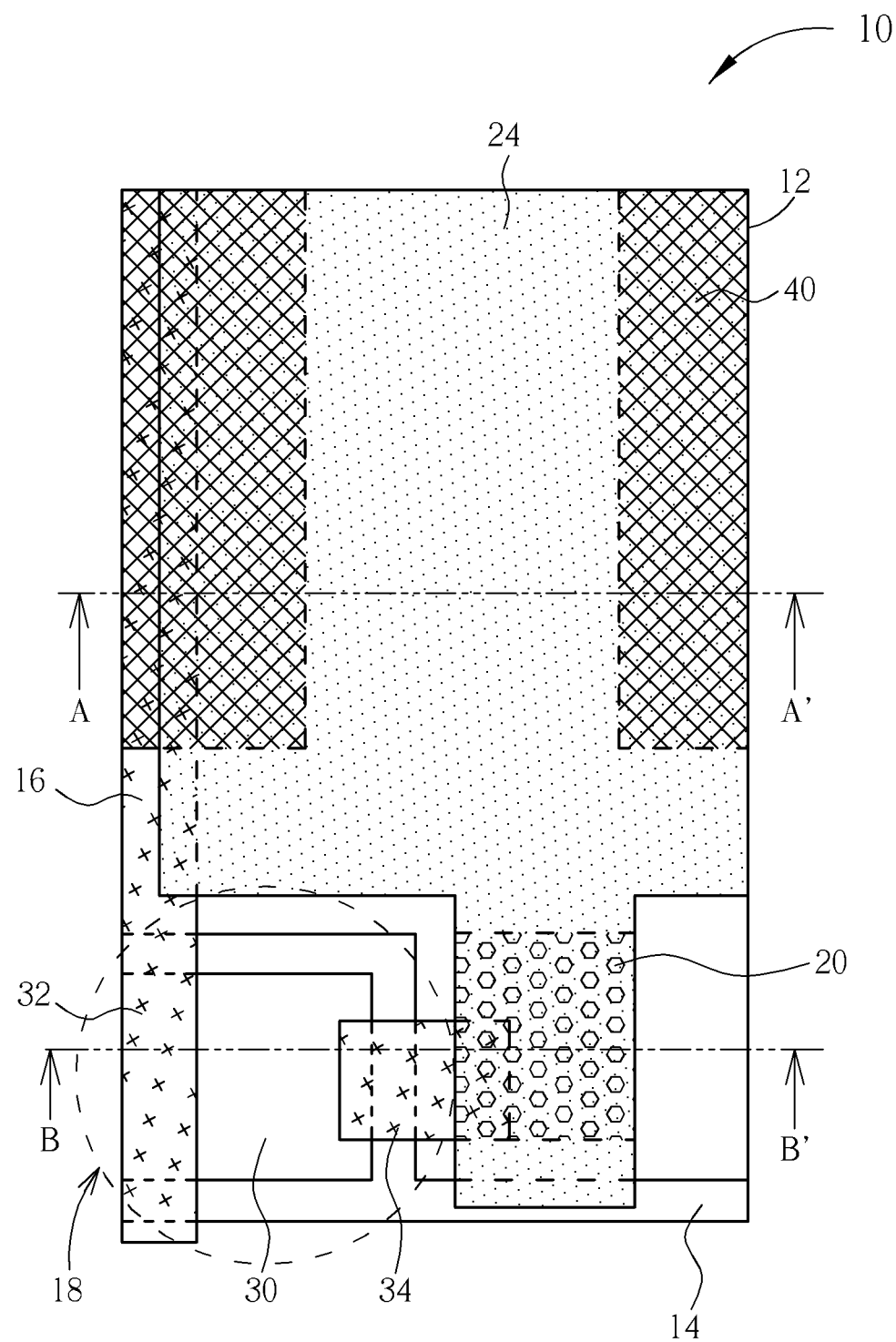
FIG. 1 is a schematic diagram illustrating a pixel structure of a display panel according to the first exemplary embodiment of the present invention.
Figure 2:
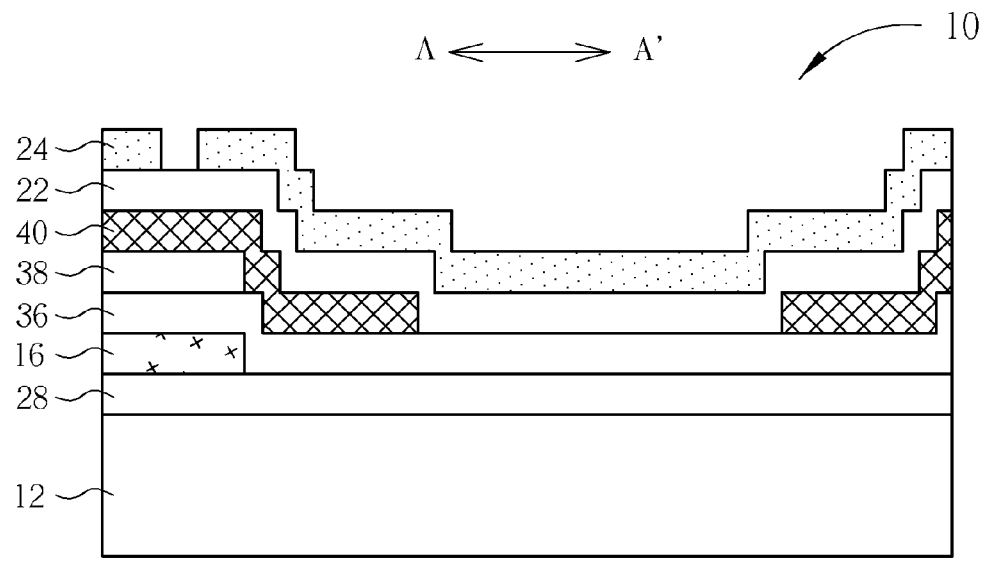
FIG. 2 is a cross-sectional view illustrating the pixel structure of a display panel taken along the line AA' of FIG. 1 according to the first exemplary embodiment of the present invention.
Figure 3:
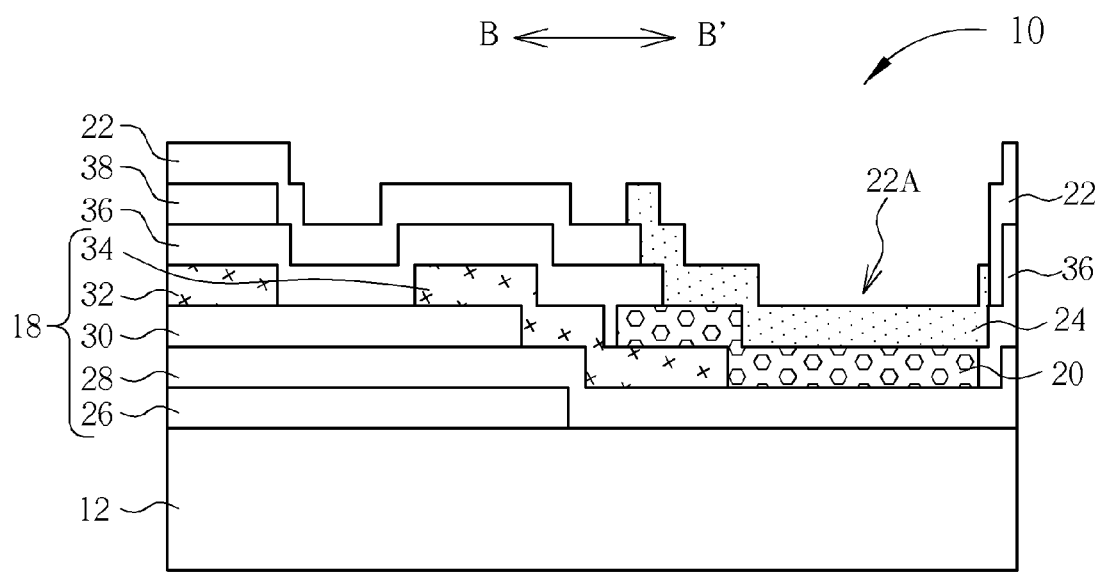
FIG. 3 is a cross-sectional view illustrating the pixel structure of a display panel taken along the line BB' of FIG. 1 according to the first exemplary embodiment of the present invention.

Please refer to FIG. 1, FIG. 2 and FIG. 3. FIG. 1 is a schematic diagram illustrating a pixel structure of a display panel according to the first exemplary embodiment of the present invention. FIG. 2 is a cross-sectional view illustrating the pixel structure of a display panel taken along the line AA' of FIG. 1 according to the first exemplary embodiment of the present invention. FIG. 3 is a cross-sectional view illustrating the pixel structure of a display panel taken along the line BB' of FIG. 1 according to the first exemplary embodiment of the present invention. As shown in FIG. 1, FIG. 2 and FIG. 3, in this exemplary embodiment, a pixel structure 10 of a display panel includes a substrate 12, a gate line 14, a data line 16, a thin film transistor (TFT) 18, a first transparent connecting pad 20, a passivation layer 22 and a transparent pixel electrode 24. The substrate 12 may be a transparent substrate including a hard substrate made of glass, quartz or plastic, or a flexible substrate. The gate line 14, the data line 16 and the thin film transistor (TFT) 18 are disposed on the substrate 12, and the thin film transistor 18 is located at the intersection of the gate line 14 and the data line 16, but not limited thereto. The thin film transistor 18 includes a gate electrode 26, a gate insulating layer 28, a semiconductor layer 30, a source electrode 32 and a drain electrode 34. The gate insulating layer 28 is disposed on the gate electrode 26 and the substrate 12, the semiconductor layer 30 is disposed on the gate insulating layer 28, and the source electrode 32 and the drain electrode 34 are disposed on the semiconductor layer 30. The gate line 14 and the gate electrode 26 are electrically connected to each other, and the data line 16 disposed on the gate insulating layer 28 is electrically connected to the source electrode 32, that is, the data line 16 and the source electrode 32 are electrically connected to each other. The first transparent connecting pad 20 is disposed on the drain electrode 34, partially overlaps and is electrically connected to the drain electrode 34. The gate line 14, the data line 16, the source electrode 32 and the drain electrode 34 may be made of opaque conductive material such as metal, and the first transparent connecting pad 20 may be made of transparent conductive material such as ITO or IZO, but not limited thereto. The passivation layer 22 disposed on the first transparent connecting pad 20 includes at least a contact hole 22A at least partially exposing the first transparent connecting pad 20. The transparent pixel electrode 24 disposed on the passivation layer 22 is electrically connected to the first transparent connecting pad 20 through the contact hole 22A of the passivation layer 22.

The pixel structure 10 of a display panel further includes an insulating layer 36, a storage capacitor line 38 (not shown in FIG. 1) and a transparent storage capacitor electrode 40. The insulating layer 36 is disposed between the thin film transistor 18 and the passivation layer 22, and the storage capacitor line 38 and the transparent storage capacitor electrode 40 are disposed between the insulating layer 36 and the passivation layer 22. More specifically, the storage capacitor line 38 is disposed on the data line 16, and the transparent storage capacitor electrode 40 is disposed on the storage capacitor line 38. The storage capacitor line 38 and the transparent storage capacitor electrode 40 are electrically connected, and the transparent storage capacitor electrode 40 partially overlaps the transparent pixel electrode 24 to form a storage capacitor. The transparent storage capacitor electrode 40 is located on the storage capacitor line 38 and the data line 16 and partially overlaps them. The disposition of the transparent storage capacitor electrode 40 may increase the storage capacitor value, which can prevent the instability of the electric field in the peripheral region of the pixel structure 10.

It is appreciated that, in this exemplary embodiment, the first transparent connecting pad 20 contacts and is electrically connected to the drain electrode 34, where the contact is direct and not through the contact hole. Furthermore, the transparent pixel electrode 24 contacts and is electrically connected to the first transparent connecting pad 20 through the contact hole 22A of the passivation layer 22. Accordingly, the transparent pixel electrode 24 may be electrically connected to the drain electrode 34 through the first transparent connecting pad 20. The present invention uses the first transparent connecting pad 20 to replace a part of the opaque drain electrode 34 and serve as the extension of the drain electrode 34 to be electrically connected to the transparent pixel electrode 24. Consequently, the transparent region in the pixel structure 10, i.e. the region where backlight can directly penetrate, may be enlarged to improve the aperture ratio of the pixel structure 10.

Figure 4:
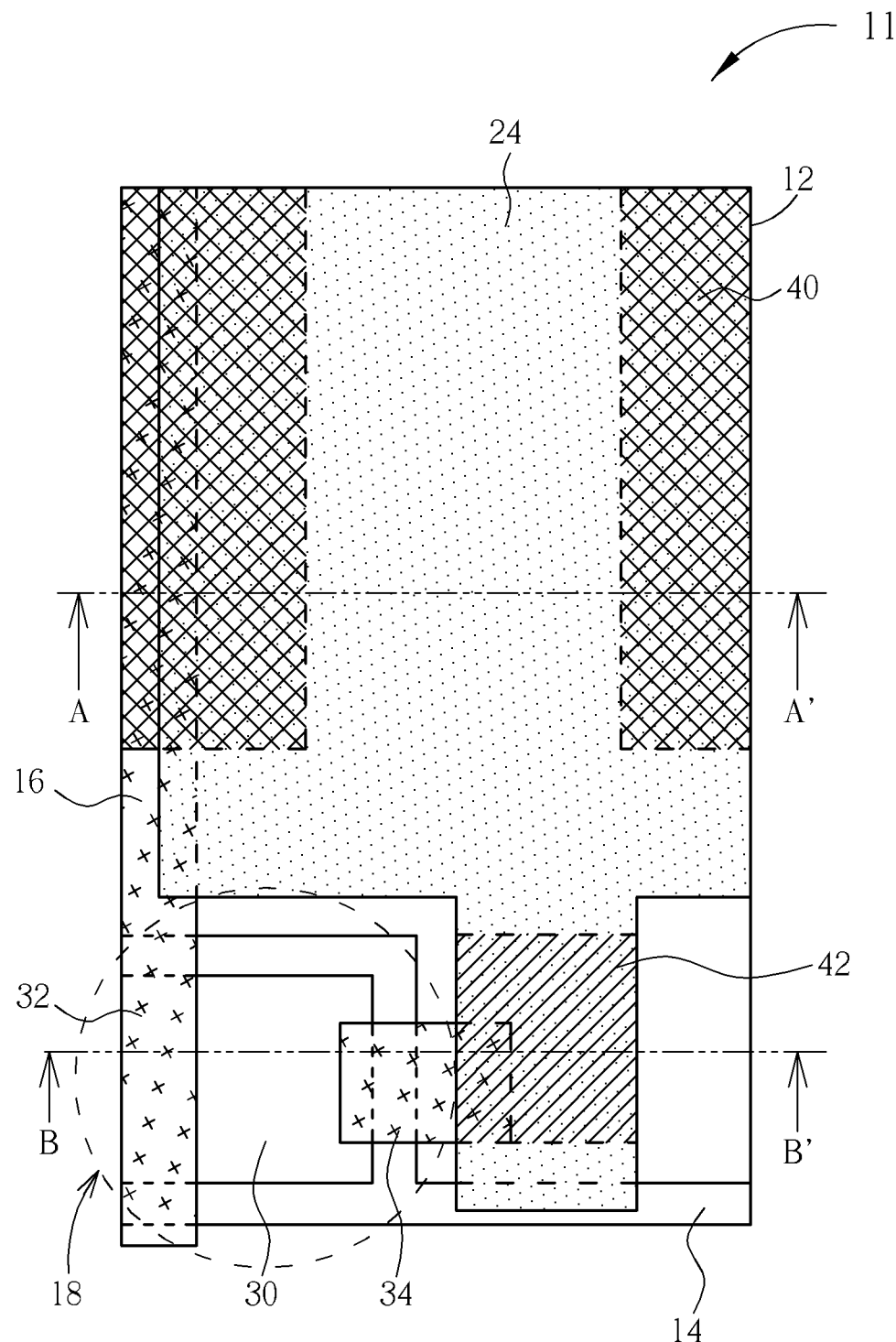
FIG. 4 is a schematic diagram illustrating a pixel structure of a display panel according to the second exemplary embodiment of the present invention.
Figure 5:
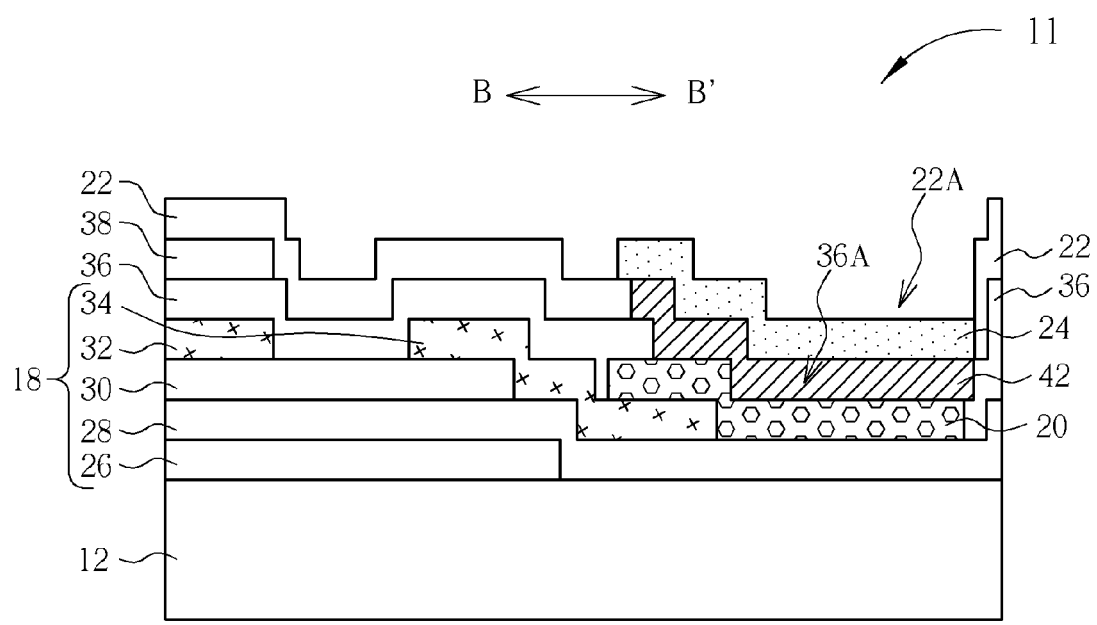
FIG. 5 is a cross-sectional view illustrating the pixel structure of a display panel taken along the line BB' of FIG. 4 according to the second exemplary embodiment of the present invention.

The pixel structure of the display panel of the present invention is not limited to the first exemplary embodiment. To simplify the explanation and to clarify the comparison, the same components are referred to with the same numerals in the following four exemplary embodiments. Please refer to FIG. 4 and FIG. 5. FIG. 4 is a schematic diagram illustrating a pixel structure of a display panel according to the second exemplary embodiment of the present invention. FIG. 5 is a cross-sectional view illustrating the pixel structure of a display panel taken along the line BB' of FIG. 4 according to the second exemplary embodiment of the present invention. Additionally, a cross-sectional view illustrates the pixel structure of a display panel taken along the line AA' of FIG. 4 according to the second exemplary embodiment of the present invention, please refer to FIG. 2. As shown in FIG. 2, FIG. 4 and FIG. 5, in the second exemplary embodiment, a pixel structure 11 of a display panel further includes a second transparent connecting pad 42. The second transparent connecting pad 42 and the transparent storage capacitor electrode 40 may be made of the same patterned transparent conducting layer, in other words, the pattern of the second transparent connecting pad 42 and the transparent storage capacitor electrode 40 could be defined by the same mask to save costs, but not limited thereto. The transparent storage capacitor electrode 40 is disposed on the storage capacitor line 38 and the data line 16, and partially overlaps them. The second transparent connecting pad 42 is disposed on the first transparent connecting pad 20. That is, the transparent storage capacitor electrode 40 and the second transparent connecting pad 42 are not electrically connected to each other. The insulating layer 36 includes at least a contact hole 36A for, at least partially, exposing the first transparent connecting pad 20. The second transparent connecting pad 42 contacts and is electrically connected to the first transparent connecting pad 20 through the contact hole 36A of the insulating layer 36. Furthermore, the transparent pixel electrode 24 contacts and is electrically connected to the second transparent connecting pad 42 through the contact hole 22A of the passivation layer 22. Accordingly, the transparent pixel electrode 24 may be electrically connected to the drain electrode 34 underneath the first transparent connecting pad 20 through the second transparent connecting pad 42 and the first transparent connecting pad 20. It is appreciated that, the present invention uses the transparent connecting pads to substitute for a part of the opaque drain electrode 34, and a number of connecting pads could be superior to one.

Figure 6:
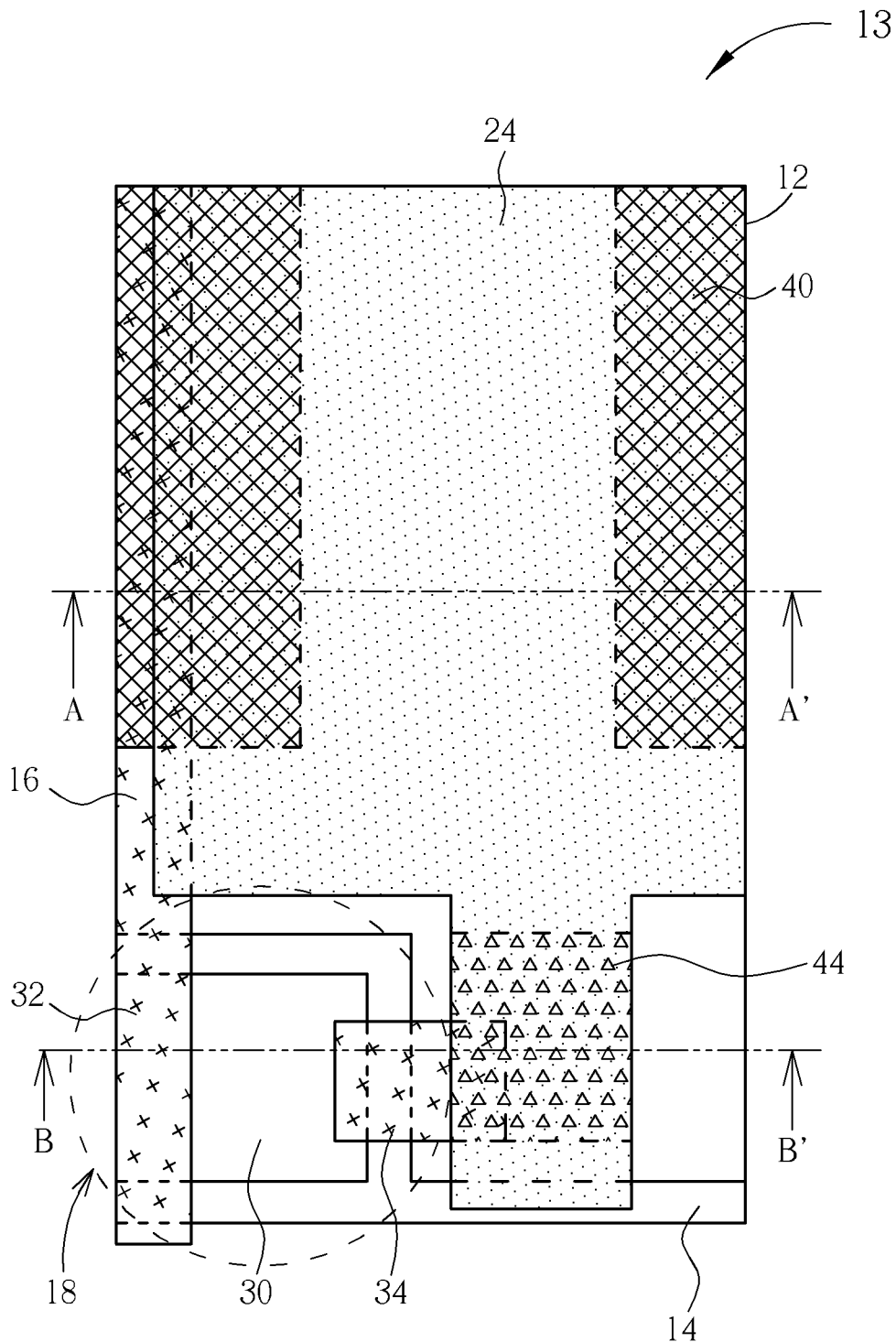
FIG. 6 is a schematic diagram illustrating a pixel structure of a display panel according to the third exemplary embodiment of the present invention.
Figure 7:
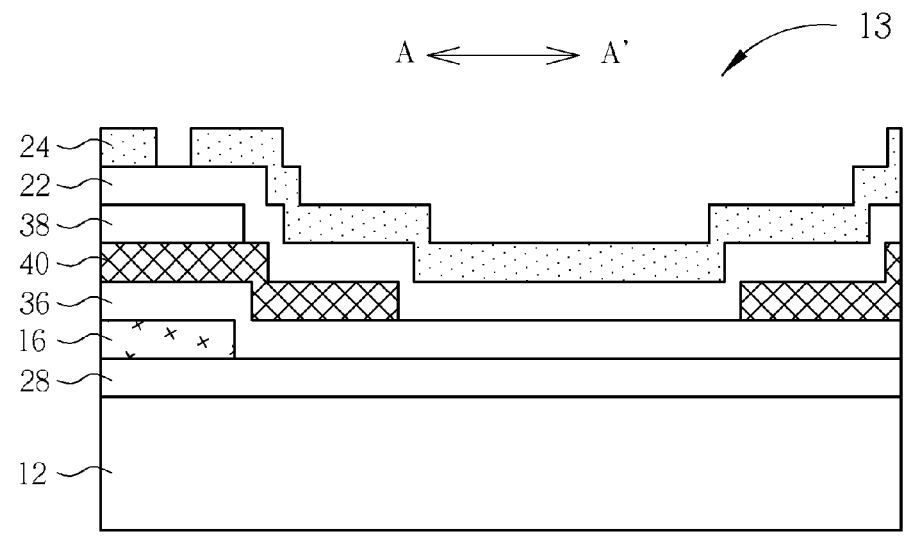
FIG. 7 is a cross-sectional view illustrating the pixel structure of a display panel taken along the line AA' of FIG. 6 according to the third exemplary embodiment of the present invention.
Figure 8:
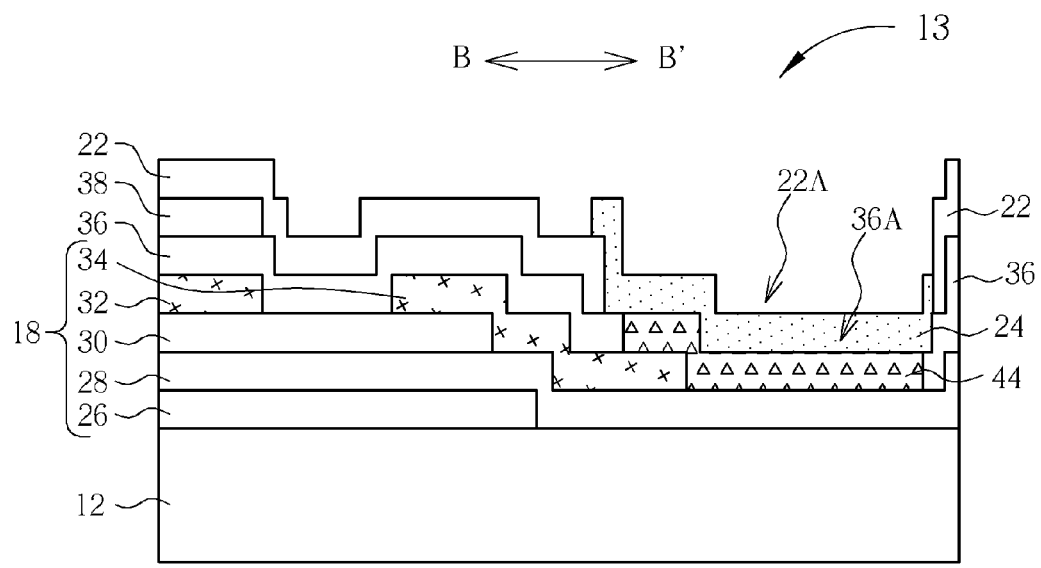
FIG. 8 is a cross-sectional view illustrating the pixel structure of a display panel taken along the line BB' of FIG. 6 according to the third exemplary embodiment of the present invention.

Please refer to FIG. 6, FIG. 7 and FIG. 8. FIG. 6 is a schematic diagram illustrating a pixel structure of a display panel according to the third exemplary embodiment of the present invention. FIG. 7 is a cross-sectional view illustrating the pixel structure of a display panel taken along the line AA' of FIG. 6 according to the third exemplary embodiment of the present invention. FIG. 8 is a cross-sectional view illustrating the pixel structure of a display panel taken along the line BB' of FIG. 6 according to the third exemplary embodiment of the present invention. As shown in FIG. 6, FIG. 7 and FIG. 8, in a pixel structure 13 of a display panel according to the third exemplary embodiment, different from the first exemplary embodiment, the first transparent connecting pad 44 and the transparent storage capacitor electrode 40 are made of the same patterned transparent conducting layer. In other words, the pattern of the first transparent connecting pad 44 and the transparent storage capacitor electrode 40 could be defined by the same mask to avoid multiple masks. Furthermore, in the third exemplary embodiment, the storage capacitor line 38 is preferably disposed on the transparent storage capacitor electrode 40, and the storage capacitor line 38 and the transparent storage capacitor electrode 40 are disposed between the insulating layer 36 and the passivation layer 22. In addition to the fabricating process of the first transparent connecting pad 44, the third exemplary embodiment also differs from the first exemplary embodiment in the deposition of the storage capacitor line 38 and the transparent storage capacitor electrode 40. As to the first exemplary embodiment, the storage capacitor line 38 is disposed underneath the transparent storage capacitor electrode 40, and they are disposed between the insulating layer 36 and the passivation layer 22.

It is appreciated that, the first transparent connecting pad 44 of the third exemplary embodiment and the transparent storage capacitor electrode 40 are made of the same patterned transparent conducting layer, so that the mask used to define the first transparent connecting pad 20 of the first exemplary embodiment can be saved. Additionally, the transparent storage capacitor electrode 40 is disposed between the insulating layer 36 and the passivation layer 22, and partially overlaps the storage capacitor line 38 and the data line 16. More specifically, the transparent storage capacitor electrode 40 is disposed on the data line 16, and the storage capacitor line 38 is disposed on the transparent storage capacitor electrode 40. The first transparent connecting pad 44 is disposed on the drain electrode 34, and the first transparent connecting pad 44 and the transparent storage capacitor electrode 40 are not electrically connected to each other. Furthermore, the insulating layer 36 includes at least a contact hole 36A at least partially exposing the drain electrode 34, and the first transparent connecting pad 44 contacts and is electrically connected to the drain electrode 34 through the contact hole 36A of the insulating layer 36, and the transparent pixel electrode 24 contacts and is electrically connected to the first transparent connecting pad 44 through the contact hole 22A of the passivation layer 22. The transparent pixel electrode 24 may be electrically connected to the drain electrode 34 underneath the first transparent connecting pad 44 through the first transparent connecting pad 44. The present invention uses the first transparent connecting pad 44 to replace a part of the opaque drain electrode 34 and complete the electrical connection between the transparent pixel electrode 24 and the drain electrode 34. Consequently, the aperture ratio of the pixel structure 13 of display panel can be improved.

Figure 9:
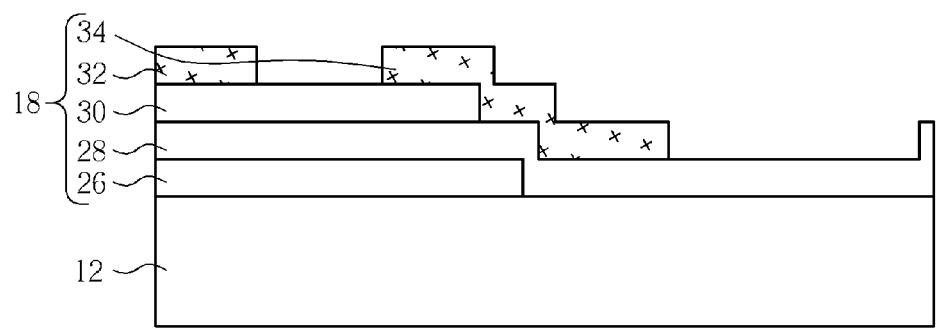
FIG. 9 through FIG. 12 are schematic diagrams illustrating a method of fabricating a pixel structure of a display panel according to the first exemplary embodiment of the present invention.

Please refer to FIG. 9 through FIG. 12. FIG. 9 through FIG. 12 are schematic diagrams illustrating a method of fabricating a pixel structure of a display panel according to the first exemplary embodiment of the present invention. As shown in FIG. 9, a substrate 12 is provided, and a thin film transistor (TFT) 18 is formed on the substrate 12. The thin film transistor 18 includes a gate electrode 26, a gate insulating layer 28, a semiconductor layer 30, a source electrode 32 and a drain electrode 34. The gate insulating layer 28 is disposed on the gate electrode 26 and the substrate 12, the semiconductor layer 30 is disposed on the gate insulating layer 28, and the source electrode 32 and the drain electrode 34 are disposed on the semiconductor layer 30. The method of forming the thin film transistor 18 includes the following steps. At first, a first metal layer (not shown) is formed on the substrate 12. Then, the first metal layer is patterned to form a plurality of gate lines (not shown) and a plurality of gate electrodes 26. Subsequently, the gate insulating layer 28 and the semiconductor layer 30 are formed in that order, followed by a formation of a second metal layer (not shown). After that, the second metal layer is patterned to form a plurality of data lines (not shown), a plurality of source electrodes 32 and a plurality of drain electrodes 34.

Figure 10:
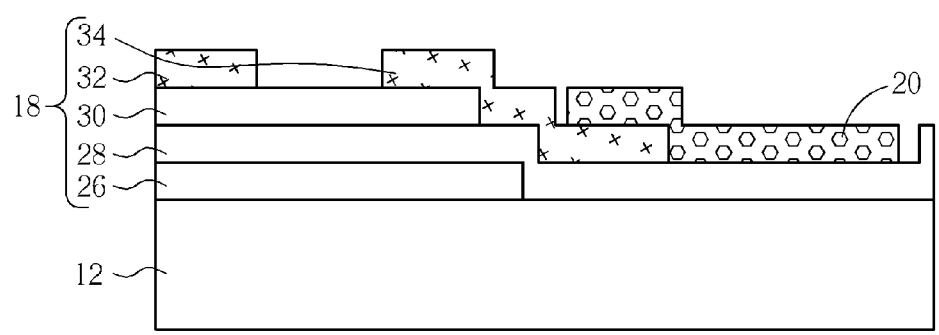

As shown in FIG. 10, a first transparent connecting pad 20 is formed on the drain electrode 34. The first transparent connecting pad 20 partially overlaps and is electrically connected to the drain electrode 34. The first transparent connecting pad 20 may be made of transparent conductive material such as ITO or IZO. The method of forming first transparent connecting pad 20 includes the following steps. A transparent conductive layer (not shown) is disposed all over the substrate 12, and a photolithography process is performed to pattern said transparent conductive layer to form the first transparent connecting pad 20, which is disposed on the drain electrode 34. Furthermore, the first transparent connecting pad 20 contacts the drain electrode 34. The first transparent connecting pad 20 partially overlaps and is electrically connected to the drain electrode 34; in other words, the first transparent connecting pad 20 can serve as an extension of the drain electrode 34, that is, in the region where the drain electrode 34 and other elements are electrically connected to each other. The present invention uses the first transparent connecting pad 20 to replace a part of the conventional opaque drain electrode; accordingly, the transparent region in the pixel structure may improve the aperture ratio.

Figure 11:
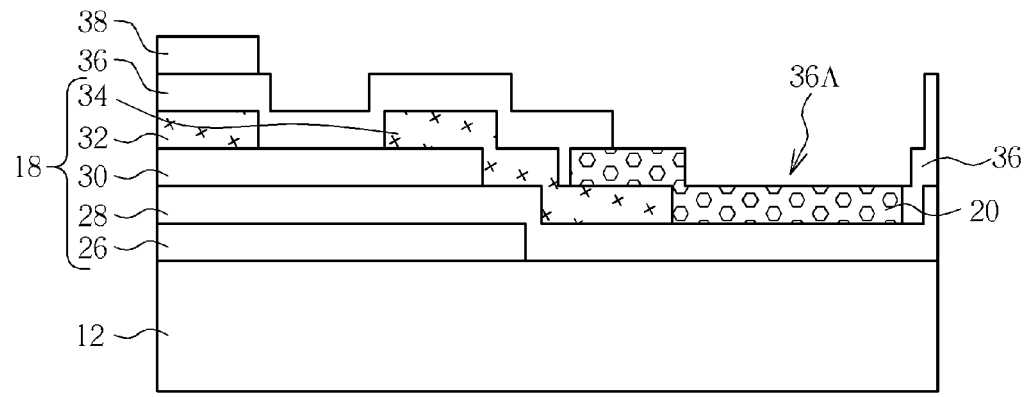

As shown in FIG. 11, an insulating layer 36 is formed on the thin film transistor 18, and the insulating layer 36 is disposed on the first transparent connecting pad 20. The insulating layer 36 may be made of transparent and insulating organic material, such as resin. Subsequently, a part of the insulating layer 36 is removed to form at least a contact hole 36A. The method of removing a part of the insulating layer 36 includes a dry etching process. Accordingly, the insulating layer 36 includes at least a contact hole 36A at least partially exposing the first transparent connecting pad 20. In order to stabilize the peripheral electric field of the later formed pixel structure, a storage capacitor line 38 and a transparent storage capacitor electrode (not shown) are further formed on the insulating layer 36. The storage capacitor line 38 may be made of conductive material such as metal, and the storage capacitor line 38 is preferably disposed on the gate line and data line to avoid reduction of the aperture ratio of the later formed pixel structure. The transparent storage capacitor electrode may be made of transparent conductive material such as ITO or IZO. The storage capacitor line 38 and the transparent storage capacitor electrode are electrically connected to each other. The transparent storage capacitor electrode can receive signals from the storage capacitor line 38, and the later formed transparent pixel electrode partially overlaps the transparent storage capacitor electrode to form a storage capacitor.

Figure 12:
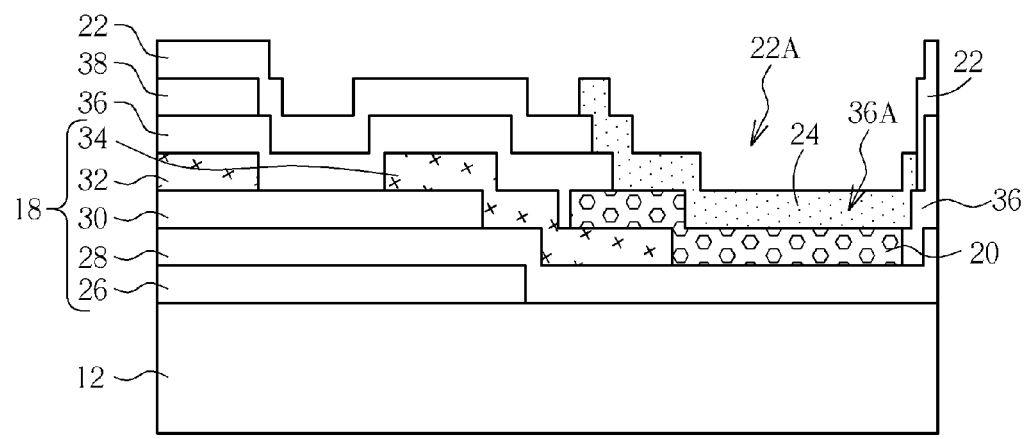

Then, as shown in FIG. 12, a passivation layer 22 is formed on the first transparent connecting pad 20, and the material of the passivation layer 22 may include transparent and insulating organic material such as resin. Subsequently, a part of the passivation layer 22 is removed, and the method of removing a part of the passivation layer 22 includes a dry etching process. Accordingly, the passivation layer 22 includes at least a contact hole 22A at least partially exposing the first transparent connecting pad 20, and the contact hole 22A of the passivation layer 22 is connected to the contact hole 36A of the insulating layer 36. Furthermore, a transparent electrode layer (not shown) made of transparent conductive material such as ITO or IZO is formed on the passivation layer 22, and the transparent electrode layer is further patterned to form transparent pixel electrodes 24. The transparent pixel electrodes 24 are electrically connected to the first transparent connecting pad 20 through the contact hole 22A of the passivation layer 22 and the contact hole 36A of the insulating layer 36. That is, the transparent pixel electrodes 24 may be electrically connected to the drain electrode 34 underneath the first transparent connecting pad 20 through the first transparent connecting pad 20.

Figure 13:
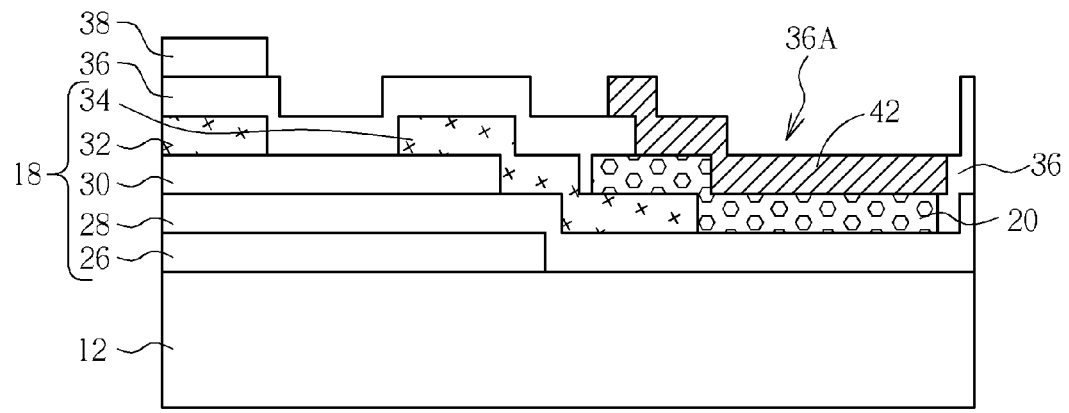
FIG. 13 is a schematic diagram illustrating a method of fabricating a pixel structure of a display panel according to the second exemplary embodiment of the present invention.

It is appreciated that, in the present invention, the transparent pixel electrode and the drain electrode are electrically connected through the transparent connecting pad, and the order of the illustrated processes and the structural disposition are not limited to the first exemplary embodiment. Moreover, the fabricating process for forming the transparent connecting pad could be an individual process as illustrated above, or be integrated into other fabricating processes of the pixel structure. Please refer to FIG. 13, and refer to FIG. 5 and FIG. 11 as well. FIG. 13 is a schematic diagram illustrating a method of fabricating a pixel structure of a display panel according to the second exemplary embodiment of the present invention. As shown in FIG. 13, after forming the contact hole 36A of the insulating layer 36 and the storage capacitor line 38, where the insulating layer 36 is disposed on the first transparent connecting pad 20, and the insulating layer 36 includes at least a contact hole 36A at least partially exposing the first transparent connecting pad 20, the second transparent connecting pad 42 is formed on the insulating layer 36 during the formation of the transparent storage capacitor electrode 40. In other words, the fabricating process of the second transparent connecting pad 42 may be integrated into the fabricating process of the transparent storage capacitor electrode 40. More specifically, the second transparent connecting pad 42 and the transparent storage capacitor electrode 40 are made of the same patterned transparent conducting layer. As the transparent storage capacitor electrode 40 is formed on the storage capacitor line 38, the second transparent connecting pad 42 could be also formed on the first transparent connecting pad 20, and the transparent storage capacitor electrode 40 and the second transparent connecting pad 42 are not electrically connected to each other. Subsequently, the passivation layer 22 is formed on the insulating layer 36 and covers the storage capacitor line 38 and the transparent storage capacitor electrode 40. Then, a part of the passivation layer 22 is removed, so that the passivation layer 22 may include at least a contact hole 22A at least partially exposing the second transparent connecting pad 42. Furthermore, a patterned transparent pixel electrode 24 is formed on the passivation layer 22, and a pixel structure as shown in FIG. 5 is completed. In this exemplary embodiment, the first transparent connecting pad 20 directly contacts and is electrically connected to the drain electrode 34; the second transparent connecting pad 42 contacts and is electrically connected to the first transparent connecting pad 20 exposed by the contact hole 36A through the contact hole 36A of the insulating layer 36; and the transparent pixel electrode 24 contacts and is electrically connected to the second transparent connecting pad 42 through the contact hole 22A of the passivation layer 22. That is, the transparent pixel electrode 24 and the drain electrode 34 underneath the first transparent connecting pad 20 may be electrically connected to each other through the second transparent connecting pad 42 and the first transparent connecting pad 20.

Figure 14:
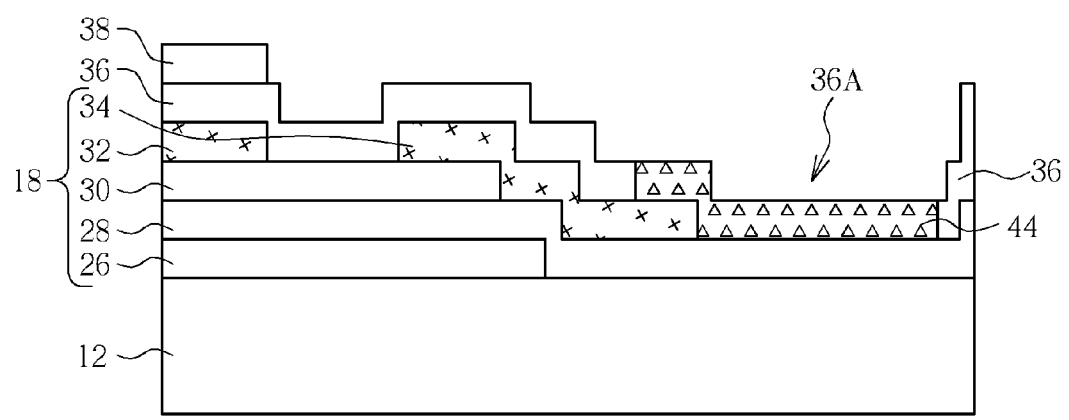
FIG. 14 is a schematic diagram illustrating a method of fabricating a pixel structure of a display panel according to the third exemplary embodiment of the present invention.

Please refer to FIG. 14, and refer to FIG. 8 and FIG. 11 together. FIG. 14 is a schematic diagram illustrating a method of fabricating a pixel structure of a display panel according to the third exemplary embodiment of the present invention. As shown in FIG. 14, after forming the contact hole 36A of the insulating layer 36 and before forming the storage capacitor line 38, the first transparent connecting pad 44 is formed on the insulating layer 36 during the formation of the transparent storage capacitor electrode 40. In other words, the fabricating process of the first transparent connecting pad 44 may be integrated into the fabricating process of the transparent storage capacitor electrode 40. More specifically, the first transparent connecting pad 44 and the transparent storage capacitor electrode 40 are made of the same patterned transparent conducting layer. As the transparent storage capacitor electrode 40 is formed on the insulating layer 36, the first transparent connecting pad 44 could be also formed on the drain electrode 34, with the transparent storage capacitor electrode 40 and the first transparent connecting pad 44 not being electrically connected to each other. In this exemplary embodiment, the first transparent connecting pad 44 is formed after the formation of the insulating layer 36. Accordingly, the first transparent connecting pad 44 is disposed on the insulating layer 36, and the insulating layer 36 includes at least a contact hole 36A at least partially exposing the drain electrode 34, which is different from the previously illustrated exemplary embodiments. In the first exemplary embodiment and the second exemplary embodiment, the contact hole 36A of the insulating layer 36 partially exposes the first transparent connecting pad 20 below the insulating layer 36 instead of the drain electrode 34. Afterward, the patterned storage capacitor line 38 and the passivation layer 22 are formed on the insulating layer 36 respectively, and the passivation layer 22 may cover the storage capacitor line 38 and the transparent storage capacitor electrode 40. Then, a part of the passivation layer 22 is removed, so that the passivation layer 22 may include at least a contact hole 22A at least partially exposing the first transparent connecting pad 44. Furthermore, a patterned transparent pixel electrode 24 is formed on the passivation layer 22, and a pixel structure, is completed as shown in FIG. 8. The first transparent connecting pad 44 contacts and is electrically connected to the drain electrode 34 through the contact hole 36A of the insulating layer 36, and the transparent pixel electrode 24 contacts and is electrically connected to the first transparent connecting pad 44 through the contact hole 22A of the passivation layer 22. That is, the transparent pixel electrode 24 and the drain electrode 34 below the first transparent connecting pad 44 may be electrically connected to each other through the first transparent connecting pad 44.

In conclusion, the present invention provides a transparent connecting pad used to electrically connect the transparent pixel electrode to the drain electrode, wherein the transparent connecting pad is disposed on, partially overlaps, and is electrically connected to the drain electrode. The transparent connecting pad may be an extension of the drain electrode, i.e. the region where the drain electrode is electrically connected to other elements. Accordingly, the transparent connecting pad made of transparent materials can substitute for a part of the conventional drain electrode made of opaque metal to enlarge the transparent region in the pixel structure, and the aperture ratio of the pixel structure may increase. Additionally, the fabricating process of the transparent connecting pad may be integrated into the other fabricating processes of the display panel to reduce the number of the used masks and save costs. For example, the first transparent connecting pad and the transparent storage capacitor electrode could be made of the same patterned transparent conducting layer, and be formed simultaneously with the same mask.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure of a display panel, comprising:
    a substrate;
    a thin film transistor (TFT) disposed on the substrate, the thin film transistor comprising:
        a gate electrode;
        a gate insulating layer disposed on the gate electrode and the substrate;
        a semiconductor layer disposed on the gate insulating layer; and
        a source electrode and a drain electrode disposed on the semiconductor layer;
    a first transparent connecting pad disposed on the drain electrode, wherein the first transparent connecting pad partially overlaps and is electrically connected to the drain electrode;
    a passivation layer disposed on the first transparent connecting pad, wherein the passivation layer comprises at least a contact hole at least partially exposing the first transparent connecting pad;
    a transparent pixel electrode disposed on the passivation layer, wherein the transparent pixel electrode is electrically connected to the first transparent connecting pad through the contact hole of the passivation layer;
    an insulating layer disposed between the thin film transistor and the passivation layer;
    a transparent storage capacitor electrode disposed between the insulating layer and the passivation layer, wherein the transparent storage capacitor electrode partially overlaps the transparent pixel electrode to form a storage capacitor;
    a gate line disposed on the substrate, wherein the gate line and the gate electrode are electrically connected to each other;
    a data line disposed on the gate insulating layer, wherein the data line and the source electrode are electrically connected to each other; and
    a storage capacitor line disposed on the insulating layer, wherein the storage capacitor line and the transparent storage capacitor electrode are electrically connected to each other.

2. The pixel structure of the display panel according to claim 1, wherein the first transparent connecting pad contacts and is electrically connected to the drain electrode, and the transparent pixel electrode contacts and is electrically connected to the first transparent connecting pad through the contact hole of the passivation layer.

3. The pixel structure of the display panel according to claim 1, wherein the first transparent connecting pad and the transparent storage capacitor electrode are made of the same patterned transparent conducting layer, wherein the insulating layer comprises at least a contact hole at least partially exposing the drain electrode, the first transparent connecting pad contacts and is electrically connected to the drain electrode through the contact hole of the insulating layer, and the transparent pixel electrode contacts and is electrically connected to the first transparent connecting pad through the contact hole of the passivation layer.

4. The pixel structure of the display panel according to claim 1, further comprising a second transparent connecting pad, the insulating layer comprising at least a contact hole at least partially exposing the first transparent connecting pad, the second transparent connecting pad contacts and is electrically connected to the first transparent connecting pad through the contact hole of the insulating layer, the transparent pixel electrode contacts and is electrically connected to the second transparent connecting pad through the contact hole of the passivation layer, and the second transparent connecting pad and the transparent storage capacitor electrode are made of the same patterned transparent conducting layer.

5. A method of fabricating a pixel structure of a display panel, comprising:
    providing a substrate;
    forming a thin film transistor (TFT) on the substrate, and the thin film transistor comprising:
        a gate electrode;
        a gate insulating layer disposed on the gate electrode and the substrate;
        a semiconductor layer disposed on the gate insulating layer; and
        a source electrode and a drain electrode disposed on the semiconductor layer;
    forming a first transparent connecting pad on the drain electrode, wherein the first transparent connecting pad partially overlaps and is electrically connected to the drain electrode;
    forming an insulating layer on the thin film transistor, wherein the insulating layer is disposed on the first transparent connecting pad and comprises at least a contact hole at least partially exposing the first transparent connecting pad;
    after forming the insulating layer, forming a passivation layer on the first transparent connecting pad, wherein the passivation layer comprises at least a contact hole at least partially exposing the first transparent connecting pad; and
    forming a transparent pixel electrode on the passivation layer, wherein the transparent pixel electrode is electrically connected to the first transparent connecting pad through the contact hole of the passivation layer;
    wherein the first transparent connecting pad contacts and is electrically connected to the drain electrode, and the transparent pixel electrode contacts and is electrically connected to the first transparent connecting pad through the contact hole of the passivation layer and the contact hole of the insulating layer.

6. The method of fabricating the pixel structure of the display panel according to claim 5, further comprising forming a second transparent connecting pad on the insulating layer, wherein the insulating layer is disposed on the first transparent connecting pad, and the insulating layer comprises at least a contact hole at least partially exposing the first transparent connecting pad; the first transparent connecting pad contacts and is electrically connected to the drain electrode, the second transparent connecting pad contacts and is electrically connected to the first transparent connecting pad through the contact hole of the insulating layer, and the transparent pixel electrode contacts and is electrically connected to the second transparent connecting pad through the contact hole of the passivation layer.

7. The method of fabricating the pixel structure of the display panel according to claim 6, further comprising forming a transparent storage capacitor electrode on the insulating layer, wherein the second transparent connecting pad and the transparent storage capacitor electrode are made of the same patterned transparent conducting layer.

* * * * *